(12) United States Patent
Nagasawa et al.

(10) Patent No.: US 10,806,031 B2
(45) Date of Patent: Oct. 13, 2020

(54) ORGANIC INSULATING BODY, METAL-CLAD LAMINATE AND WIRING BOARD

(71) Applicant: KYOCERA Corporation, Kyoto-shi, Kyoto (JP)

(72) Inventors: Tadashi Nagasawa, Kirishima (JP); Chie Chikara, Kirishima (JP); Satoshi Kajita, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/319,183

(22) PCT Filed: Jul. 19, 2017

(86) PCT No.: PCT/JP2017/026109
§ 371 (c)(1),
(2) Date: Jan. 18, 2019

(87) PCT Pub. No.: WO2018/016527
PCT Pub. Date: Jan. 25, 2018

(65) Prior Publication Data
US 2020/0077514 A1 Mar. 5, 2020

(30) Foreign Application Priority Data

Jul. 22, 2016 (JP) ................................ 2016-144463
Nov. 29, 2016 (JP) ................................ 2016-231464
Dec. 17, 2016 (JP) ................................ 2016-244954

(51) Int. Cl.
| | | |
|---|---|---|
| H05K 1/03 | (2006.01) | |
| B32B 15/085 | (2006.01) | |
| C08K 5/14 | (2006.01) | |
| H05K 1/09 | (2006.01) | |

(52) U.S. Cl.
CPC ........... *H05K 1/036* (2013.01); *B32B 15/085* (2013.01); *C08K 5/14* (2013.01); *H05K 1/09* (2013.01); *H05K 2201/012* (2013.01)

(58) Field of Classification Search
CPC ...... H05K 1/035; H05K 1/036; H05K 1/0366; H05K 1/0373; H05K 1/0353
See application file for complete search history.

(56) References Cited

U.S. PATENT DOCUMENTS

| 4,992,511 A | 2/1991 | Yamamoto et al. |
| 2015/0075852 A1* | 3/2015 | Inoue ................... C09D 163/00 174/258 |
| 2017/0260364 A1* | 9/2017 | Hsieh ....................... C08K 5/53 |
| 2019/0062541 A1 | 2/2019 | Saito et al. |

FOREIGN PATENT DOCUMENTS

| JP | 02-167318 A | 6/1990 |
| JP | 06-228377 A | 8/1994 |
| JP | 2002-318301 A | 10/2002 |

(Continued)

*Primary Examiner* — Jeremy C Norris
(74) *Attorney, Agent, or Firm* — Volpe and Koenig, P.C.

(57) ABSTRACT

There is provided an organic insulating body which contains a cyclic olefin copolymer as a main component and a peroxide having a benzene ring, and has such a property that a loss tangent peak appears at 120° C. or higher in a dynamic mechanical analysis.

7 Claims, 6 Drawing Sheets

(56) References Cited

FOREIGN PATENT DOCUMENTS

| | | |
|---|---|---|
| JP | 2003-238761 A | 8/2003 |
| JP | 2010-100843 A | 5/2010 |
| JP | 2014-101503 A | 6/2014 |
| JP | 2014-156250 A | 8/2014 |
| WO | 2017/150218 A1 | 9/2017 |

* cited by examiner

under the US 10,806,031 B2

ORGANIC INSULATING BODY, METAL-CLAD LAMINATE AND WIRING BOARD

TECHNICAL FIELD

The present disclosure relates to an organic insulating body, a metal-clad laminate and a wiring board.

BACKGROUND ART

In recent years, speeding up and high integration of LSIs and increase in memory capacities are progressing, and accordingly reduction in size, weight, thickness and the like of various electronic components are rapidly progressing. Heretofore, in wiring boards and the like used in the field of these electronic components, a cyclic olefin copolymer such as those disclosed in Patent Document 1 has been used as an insulating material. The insulating material has been used in a copper-clad substrate that has a copper foil bonded on the surface thereof and a wiring board for high frequency applications.

RELATED ART DOCUMENT

Patent Document

Patent Document 1: Japanese Unexamined Patent Publication No. 2010-100843

SUMMARY OF THE INVENTION

An organic insulating body according to the present disclosure contains a cyclic olefin copolymer as a main component and a peroxide having a benzene ring, and has such a property that a loss tangent peak appears at 120° C. or higher in dynamic mechanical analysis.

A metal-clad laminate according to the present invention is provided with the organic insulating body and a metallic foil laminated on at least one surface of the organic insulating body.

A wiring board according to the present disclosure is provided with a plurality of insulating layers and a plurality of conductor layers respectively arranged between the insulating layers, wherein each of the insulating layers is formed from the organic insulating body.

BRIEF DESCRIPTION OF THE DRAWINGS

FIG. 6 shows analysis results obtained by time-of-flight secondary ion mass spectrometry, wherein

EMBODIMENTS FOR CARRYING OUT THE INVENTION

The cyclic olefin copolymer disclosed in Patent Document 1 has a lower dielectric tangent and therefore is improved in dielectric properties compared with epoxy resins that have been used in FR-4 and the like heretofore. However, in the cyclic olefin copolymer, the dielectric tangent is not sufficiently low and therefore there is concern that it may be difficult to compensate dielectric properties (electric properties). Furthermore, in the case where the cyclic olefin copolymer is a thermoplastic resin, when the thermoplastic resin is heated at a temperature equal to or higher than the glass transition temperature (Tg) thereof, the rapid decrease in an elastic modulus occurs. Accordingly, the use of the cyclic olefin copolymer as a substrate material such as a prepreg is limited. For example, when a cross-linking agent, a flame retardant agent or the like is added to the cyclic olefin copolymer, although Tg is increased, the dielectric tangent is also increased.

The cyclic olefin copolymer can be used as a material for an organic insulating body. The organic insulating body is sometimes used in a wiring board for high frequency applications. In the wiring board for high frequency applications, in order to improve high-frequency properties, it is required to reduce the surface roughness of a copper foil to be bonded to the organic insulating body. However, when the surface roughness of the copper foil is reduced, the bond strength between the copper foil and the organic insulating body is also reduced.

The organic insulating body according to the present disclosure contains a cyclic olefin copolymer as the main component and a peroxide having a benzene ring. The organic insulating body according to the present disclosure is formed from a resin composition containing a cyclic olefin copolymer as the main component and a peroxide having a benzene ring. Hereinbelow, the components contained in the organic insulating body (resin composition) according to the present disclosure will be described in detail. The wording "a cyclic olefin copolymer as the main component" as used herein means that the percentage of a cyclic olefin copolymer to be contained in the organic insulating body is 60% by mass or more.

Figure 1:
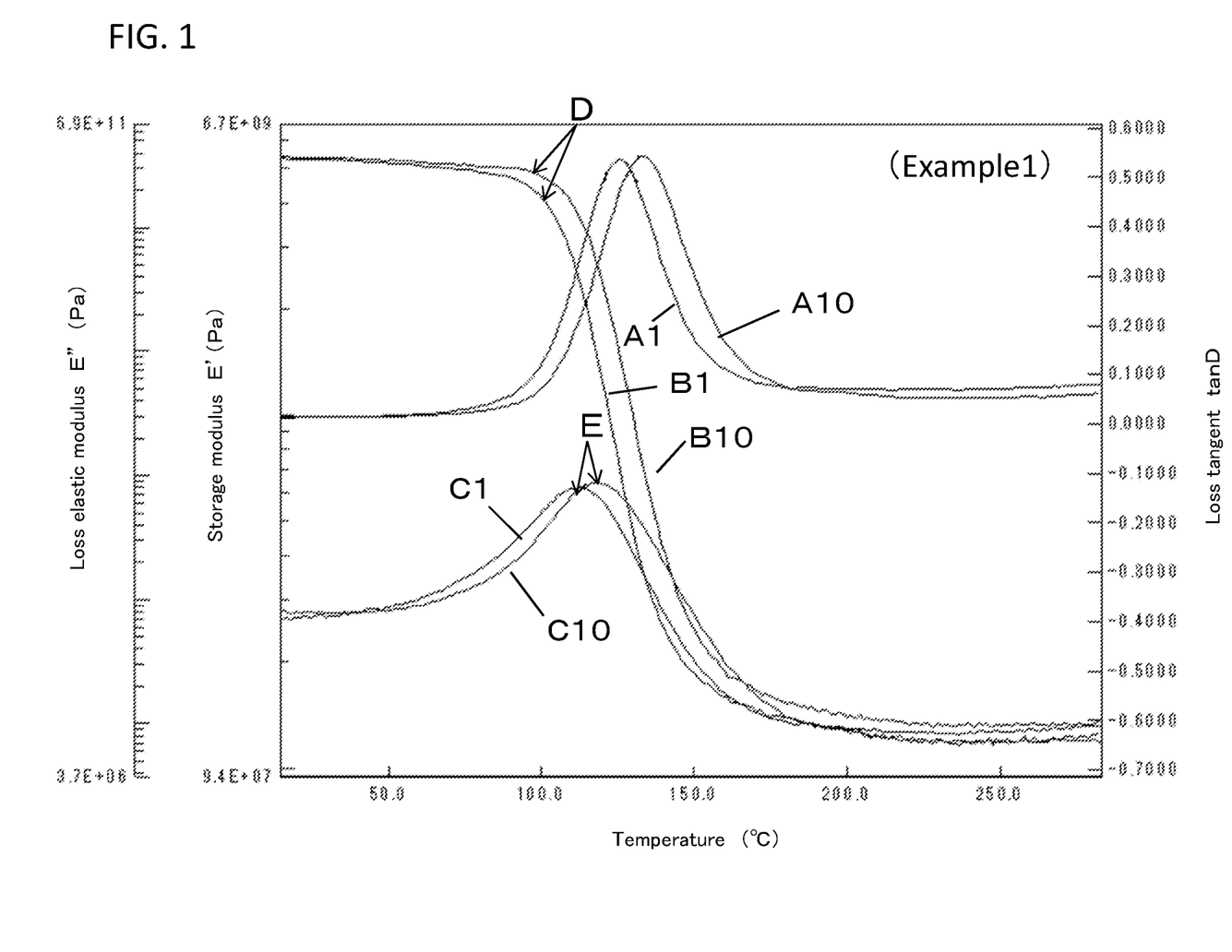
FIG. 1 shows data of the measurement of dynamic viscoelasticity of a first embodiment of an organic insulating body (Example 1).

FIG. 1 shows data of the measurement of dynamic viscoelasticity of a first embodiment of the organic insulating body. The dynamic mechanical analysis data shown in FIG. 1 correspond to the measurement data obtained in Example 1 mentioned below. In FIG. 1, the temperature dependency of each of properties, i.e., loss tangent (reference characters A1 and A10), storage elastic modulus (reference characters B1 and B10) and loss elastic modulus (reference characters C1 and C10) is shown. In this regard, a numeral written at the back of an alphabet in each of the reference characters represents a frequency at which the measurement on each of the properties is carried out. For example, "A1" means that the measurement is carried out at 1 Hz and "A10" means that the measurement is carried out at 10 Hz.

As shown in FIG. 1, in the organic insulating body according to the present embodiment, all of loss tangent peaks determined by the measurement of dynamic viscoelasticity appear at 120° C. or higher at all frequencies. Namely, the organic insulating body is one in which a cyclic olefin copolymer having thermosetting properties is contained as the main component. According to this configuration, it becomes possible to produce an organic insulating body having low temperature dependency and a low dielectric constant and a low dielectric tangent in a high frequency region. The dielectric properties of the organic insulating body according to the first embodiment are as follows: the dielectric constant is 2.7 or less and the dielectric tangent is 0.002 or less at 30 GHz even at 125° C.

The term "loss tangent peak" as used herein refers to a part at which such a change that a loss tangent in a specific temperature range becomes higher than that in the surrounding region in a loss tangent curve obtained by the measurement of dynamic viscoelasticities in a temperature range from room temperature to about 300° C. occurs. In FIG. 1, for example, a loss tangent peak is a part at which the loss tangent is changed by three times or more when the temperature is changed by 50° C.

This is because the cyclic olefin copolymer, which is the main component of the organic insulating body, is bonded through the peroxide having a benzene ring and accordingly the entire molecular structure in the organic insulating body is isotropic and has such a stable structure that atoms are constrained and therefore the relative positions between the atoms are less likely to change.

The organic insulating body according to the first embodiment has such a property that, in the dynamic mechanical analysis data shown in FIG. 1, each of a temperature at which the storage elastic modulus (B) is rapidly decreased (inflection point D) and a temperature at which the loss elastic modulus becomes maximum (peak temperature E) is 100° C. or higher. As apparent from these results, the organic insulating body has heat resistance to a temperature of 100° C. or higher. From these properties, the organic insulating body according to the present embodiment becomes useful in the field of a wiring board to be used in a high-frequency region, particularly as a wiring board having excellent high-temperature load life.

Figure 2:
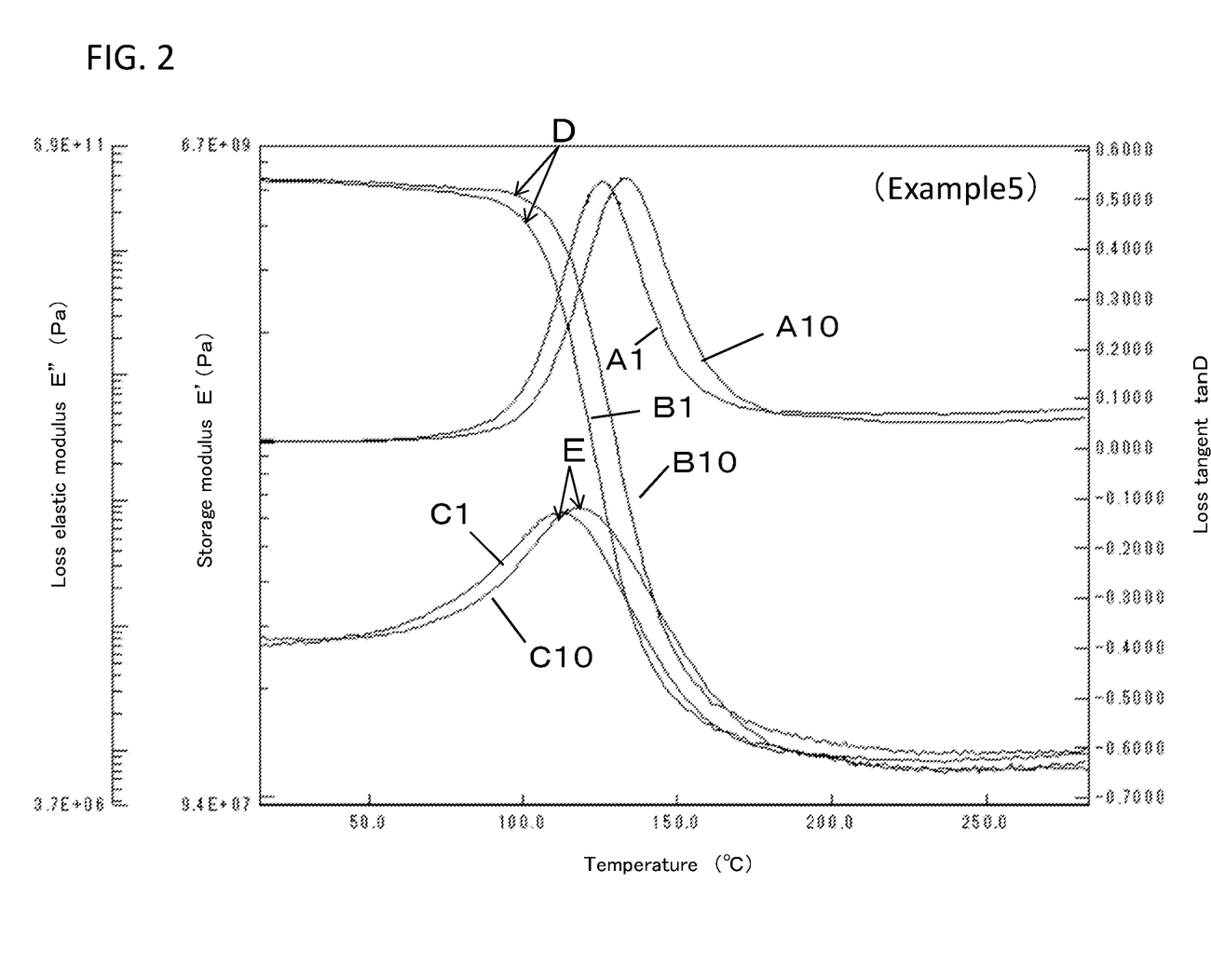
FIG. 2 shows data of the measurement of dynamic viscoelasticity of the first embodiment of the organic insulating body (Example 5).

FIG. 2 also shows the data of the measurement of dynamic viscoelasticity of the organic insulating body according to the first embodiment. The dynamic mechanical analysis data shown in FIG. 2 corresponds to the measurement data obtained in Example 5 mentioned below. The reference characters in FIG. 2 are as described in the explanation of FIG. 1 above, and detailed explanation about the reference characters are omitted. It is found that, in FIG. 2, the same behavior as shown in FIG. 1 is exhibited.

The cyclic olefin copolymer is a polyolefin-type copolymer having a cyclic structure. More specifically, the cyclic olefin copolymer is a copolymer of a cyclic olefin and another monomer copolymerizable with the cyclic olefin. The ratio of the content of the cyclic olefin to the content of the other monomer is not particularly limited. For example, it is preferred that the cyclic olefin is contained in an amount of about 10 to 80% by mass and the other monomer is contained in an amount of about 20 to 90% by mass.

Examples of the cyclic olefin include a norbornene-type monomer, a cyclic diene-type monomer and a vinyl alicyclic hydrocarbon-type monomer. Specific examples of the cyclic olefin include norbornene, vinylnorbornene, phenylnorbornene, dicyclopentadiene, tetracyclododecene, cyclopropene, cyclobutene, cyclopentene, cyclohexene, cyclohexadiene and cyclooctadiene. These cyclic olefins may be used singly, or two or more of them may be used in combination.

Examples of the other monomer copolymerizable with the cyclic olefin include a linear olefin, acrylic acid, methacrylic acid, an acrylate, a methacrylate, an aromatic vinyl compound, an unsaturated nitrile and an aliphatic conjugated diene. Specific examples of the monomer include ethylene, propylene, butene, acrylic acid, methacrylic acid, fumaric acid, anhydrous fumaric acid, maleic acid, anhydrous maleic acid, methyl acrylate, ethyl acrylate, n-propyl acrylate, isopropyl acrylate, methyl methacrylate, ethyl methacrylate, n-propyl methacrylate, isopropyl methacrylate, styrene, vinyltoluene, acrylonitrile, methacrylonitrile, 1,3-butadiene, 2-methyl-1,3-butadiene and 2,3-dimethyl-1,3-butadiene. These other monomers may be used singly, or two or more of them may be used in combination.

The cyclic olefin copolymer to be contained in the organic insulating body according to the first embodiment may have a crosslinkable functional group in the molecule thereof. The crosslinkable functional group is preferably one of which the crosslinking reaction can proceed by the action of a peroxide having a benzene ring. Examples of the functional group include a vinyl group, an allyl group, an acryl group and a methacryl group. As the cyclic olefin copolymer, LCOC-4 manufactured by Mitsui Chemicals, Inc. can be mentioned, for example.

The peroxide having a benzene ring to be contained in the organic insulating body according to the first embodiment is one which can act as a radical initiator. Namely, the peroxide is used for crosslinking at least a part of the cyclic olefin copolymer having a crosslinkable functional group in the molecule thereof through a radical reaction. As a result, an organic insulating body can be produced, which has a lower dielectric tangent and a higher Tg compared with those of a peroxide having no benzene ring in the molecule thereof. It is assumed that this is because a radical spices derived from the peroxide having a benzene ring in the molecule thereof can be mixed easily with a crosslinking moiety in the cyclic olefin copolymer and an active group in the peroxide having a benzene ring in the molecule thereof can react with the crosslinking moiety in the cyclic olefin copolymer preferentially. From the viewpoint of this reactivity, as the peroxide, a peroxide having at least two benzene rings in the molecule thereof is preferably used.

Examples of the peroxide having a benzene ring in the molecule thereof include t-butyl peroxybenzoate, α,α'-di-(t-butylperoxy)diisopropylbenzene, t-butylcumylperoxide and dicumylperoxide. These compounds are commercially available under the name of, for example, "PERCURE VS", "PERBUTYL P", "PERBUTYL C" and "PERCUMYL D" (all manufactured by NOF CORPORATION).

In the organic insulating body according to the first embodiment, it is preferred that the peroxide having a benzene ring in the molecule thereof is contained in an amount of 1 to 8% by mass when the total amount of the cyclic olefin copolymer and the peroxide is 100% by mass. When the peroxide having a benzene ring in the molecule thereof is contained in this amount, the crosslinking reaction of the cyclic olefin copolymer can proceed more efficiently and the dielectric tangent can be further decreased. In addition, the peroxide having a benzene ring in the molecule thereof may be contained in an amount of 1 to 3% by mass when the total amount of the cyclic olefin copolymer and the peroxide is 100% by mass.

In the organic insulating body according to the first embodiment, additives such as a flame retardant agent, a stress releaser, an antioxidant agent, a thermal stabilizer, an antistatic agent, a plasticizer, a pigment, a dye and a coloring agent may contained as required, as long as the effects of the organic insulating body cannot be deteriorated.

The flame retardant agent is not particularly limited, and examples thereof include melamine phosphate, melam polyphosphate, melem polyphosphate, melamine pyrophosphate, ammonium polyphosphate, red phosphorus, an aromatic phosphate, a phosphonate, a phosphinate, phosphine oxide, phosphazene, melamine cyanurate, and a bromine-type flame retardant agent (e.g., ethylene bispentabromobenzene, ethylene bistetrabromophthalimide). These flame retardant agents may be used singly, or two or more of them may be used in combination. From the viewpoint of dielectric tangent, flame resistance, heat resistance, adhesion, moisture resistance, chemical resistance, reliability and the like, a bromine-type flame retardant agent, melamine pyrophosphate, melamine polyphosphate, melam polyphosphate or ammonium polyphosphate is preferred.

It is preferred that the flame retardant agent is contained in an amount of 15 to 45 parts by mass when the total amount of the cyclic olefin copolymer and the peroxide is 100 parts by mass. When the flame retardant agent is contained in this amount, flame resistance and heat resistance can be further improved without exerting little influence on dielectric tangent, adhesion and moisture resistance.

The stress releaser is not particularly limited, and an example thereof is silicone resin particles. Examples of the silicone resin particle include: a silicon rubber powder such as KMP-597 (manufactured by Shin-Etsu Chemical Co., Ltd.) and X-52-875 (manufactured by Shin-Etsu Chemical Co., Ltd.); and a silicon resin powder such as KMP-590 (manufactured by Shin-Etsu Chemical Co., Ltd.) and X-52-1621 (manufactured by Shin-Etsu Chemical Co., Ltd.). These stress releasers may be used singly, or two or more of them may be used in combination.

As the stress releaser, one having a mean particle size of 10 µm or less may be used. When a stress releaser having this mean particle size is used, the adhesion to a metallic foil can be further improved in the case where the resin composition is used in a metal-clad laminate or the like. It is preferred that the stress releaser is contained in an amount of 1 to 10 parts by mass when the total amount of the cyclic olefin copolymer and the peroxide is 100 parts by mass. When the stress releaser is contained in this amount, the adhesion to a metallic foil that serves as a conductor layer and moisture absorption resistance can be further improved in the case where the organic insulating body is applied to a wiring board or the like. The through-hole connection reliability can also be further improved.

As the additives other than the flame retardant agent and the stress releaser, a pigment such as R-42 (manufactured by Sakai Chemical Co., Ltd.), a thermal stability such as IRGANOX1010 (manufactured by BASF), a light stabilizer such a CHIMASSORB944 (manufactured by Ciba), and the like can be mentioned.

The organic insulating body according to the first embodiment is formed from a resin composition produced by mixing the cyclic olefin copolymer and the peroxide having a benzene ring and optionally other components together. The method for mixing these components is not particularly limited. Examples of the mixing method include a solution mixing method in which all of the components are dissolved or dispersed in a solvent homogeneously, and a melt blend method in which the mixing is carried out while heating with an extruder.

A preferred example of the solvent to be used in the solution mixing method is xylene. In this case, the ratio of the mass of the solid material (the resin) to the mass of the solvent is not particularly limited, and is preferably, for example, 60:40 to 20:80. Besides xylene, an aromatic solvent such as toluene, benzene and ethylbenzene, a hydrocarbon-type solvent such as normal hexane, cyclohexane and methylcyclohexane, a ketone-type solvent such as acetone, or other solvent such as tetrahydrofuran and chloroform may be used. Alternatively, xylene and any one of the other solvents may be used in combination.

From the viewpoint of heat resistance, the cyclic olefin copolymer that constitutes the organic insulating body is preferably contains a thermosetting cyclic olefin copolymer as the main component. Alternatively, a complex of the thermosetting cyclic olefin copolymer and a thermoplastic cyclic olefin copolymer may be used, as long as the thermosetting cyclic olefin copolymer is contained in a specified amount or more as the main component of the organic insulating body.

Figure 3:
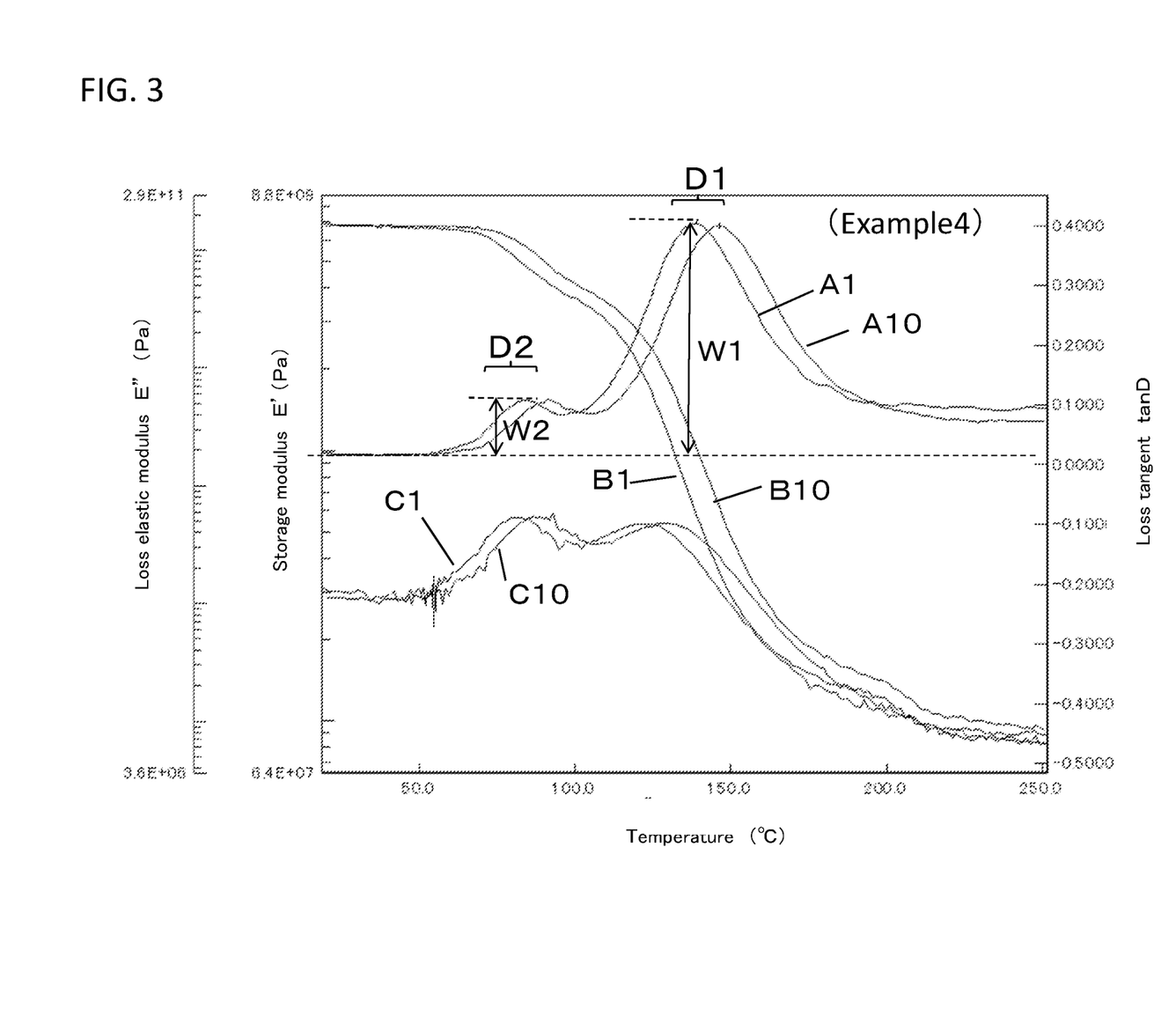
FIG. 3 shows data of the measurement of dynamic viscoelasticity of a second embodiment of an organic insulating body (Example 4).

FIG. 3 shows data obtained by measuring the dynamic viscoelasticity of an organic insulating body containing, as the main component, a complex of a thermosetting cyclic olefin copolymer and a thermoplastic cyclic olefin copolymer (an organic insulating body according to the second embodiment). The dynamic mechanical analysis data shown in FIG. 3 corresponds to Example 4 mentioned below. The reference characters shown in FIG. 3 are the same as those described with the explanation of FIG. 1 mentioned above, and the detailed explanation of the reference characters is omitted.

In the organic insulating body, the cyclic olefin copolymer is a complex of a thermosetting cyclic olefin copolymer and a thermoplastic cyclic olefin copolymer. Therefore, a loss tangent peak appears at two points, i.e., a point in a temperature range of 120 to 150° C. which is indicated by reference character D1 and a point in a temperature range of 80 to 100° C. which is indicated by reference character D2.

In the case where the cyclic olefin copolymer, which is the main component of the organic insulating body, is a complex of a thermosetting cyclic olefin copolymer and a thermoplastic cyclic olefin copolymer, the dielectric constant and the dielectric tangent of the organic insulating body can be further decreased compared with the case where the cyclic olefin copolymer is a thermosetting cyclic olefin copolymer. In this case, the dielectric properties of the organic insulating body are as follows: the dielectric constant is 2.69 or less and the dielectric tangent is 0.0019 or less at 30 GHz.

In the case where the cyclic olefin copolymer is a complex of a thermosetting cyclic olefin copolymer and a thermoplastic cyclic olefin copolymer, the content of the thermosetting cyclic olefin copolymer in the complex is 60% or more, particularly 80 to 95% inclusive, as determined by the method shown in FIG. 3, from the viewpoint that heat resistance of the organic insulating body can be retained. The content Rw of the thermosetting cyclic olefin copolymer in the complex can be determined from the loss tangent data shown in FIG. 3. More specifically, as shown in FIG. 3, Rw can be determined in accordance with formula (I), when W1 represents a loss tangent associated with the thermosetting cyclic olefin copolymer and W2 represents a loss tangent associated with the thermoplastic cyclic olefin copolymer.

$$Rw=(W1/(W1+W2))\times 100 \qquad (I)$$

In this case, it is preferred that the organic insulating body has a storage modulus of $8\times 10^7$ Pa or more in a temperature region of 200° C. or lower, as determined by dynamic mechanical analysis. This is because it becomes possible to produce an organic insulating body of which both of dielectric constant and dielectric loss can be kept at low levels even when heated for a long period as long as the heating temperature is 200° C. or lower.

Figure 4:
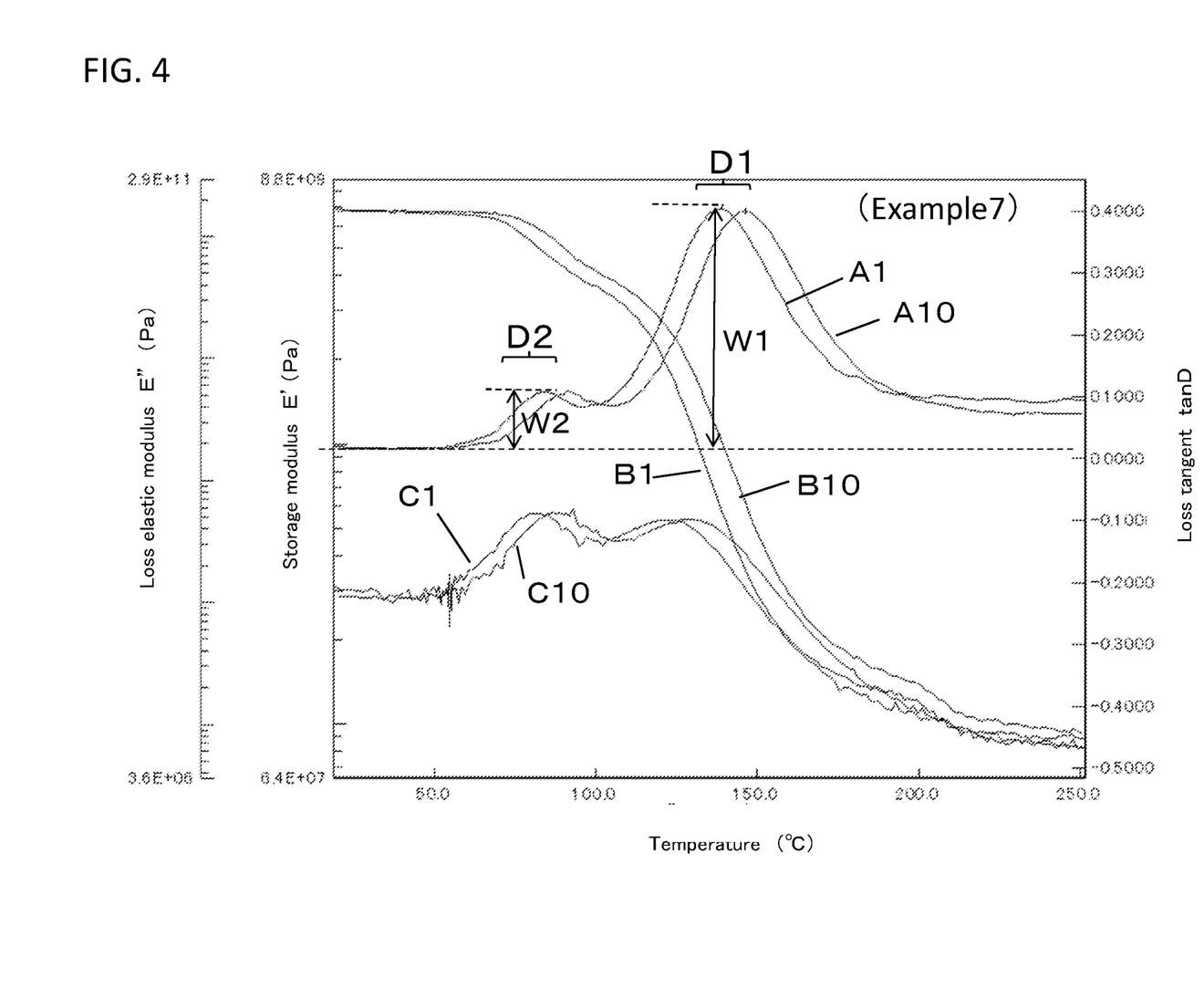
FIG. 4 shows data of the measurement of dynamic viscoelasticity of the second embodiment of the organic insulating body (Example 7).

FIG. 4 also shows data of the measurement of dynamic viscoelasticity of the organic insulating body according to the second embodiment. The dynamic mechanical analysis data shown in FIG. 4 correspond to the measurement data obtained in Example 7 mentioned below. The reference characters in FIG. 4 are as described in the explanation of FIG. 1 above, and detailed explanation about the reference characters are omitted. It is found that, in FIG. 4, the same behavior as shown in FIG. 3 is exhibited.

In the resin composition for producing the organic insulating body, it is preferred to add an inorganic filler as long as a sheet can be molded. Examples of the inorganic filler include silica, talc, mica, clay, calcium carbonate, titanium oxide, barium titanate, carbon black, glass beads and glass hollow balls. Examples of silica include ground silica and fused silica. As these inorganic fillers, SFP-30M and SFP-130MC (both manufactured by Denka Company Limited), FUSELEX E-2, Adma FineSO-C5 and PLV-3 (all manufactured by Tatsumori Ltd.) and the like are commercially available. These inorganic fillers may be used singly, or two or more of them may be used in the form of a mixture.

For example, in the case where the resin composition (organic insulating body) is used in a metal-clad laminate, in order to further improve the adhesion of the organic insulating body to a metallic foil, an inorganic filler having a mean particle size of 10 μm or less can be used preferably, and an inorganic filler having a mean particle size of 10 nm to 10 μm may be used preferably. The content of the inorganic filler is preferably 5 to 40 parts by mass when the total amount of the cyclic olefin copolymer and the peroxide is 100 parts by mass. When the inorganic filler is contained in this amount, the melt fluidability of the resin composition can be further improved. In addition, when the resin composition is used in, for example, a metal-clad laminate, the adhesion of the organic insulating body to a metallic foil can be further improved and through-hole connection reliability can also be further improved. If necessary, a plating treatment and the like is applied preferably to the surface of the conductor layer.

In the case where the resin composition is molded into a sheet-like article, a reinforcing material may be used as required. Examples of the reinforcing material include a woven fabric and a non-woven fabric of glass fibers, polyimide fibers and the like, and paper. Examples of the material for the glass include normal E glass, D glass, S glass and quartz glass.

The sheet-like molded article produced in this manner may have a glass transition temperature of 160° C. or higher. When the glass transition temperature is 160° C. or higher, sufficient heat resistance can be achieved.

The method for producing the sheet-like molded article is not particularly limited. For example, it is possible to disperse the inorganic filler in the resin composition and then mold the resultant product into a sheet-like form, or it also possible to apply the resin composition onto the reinforcing material or impregnate the reinforcing material with the resin composition, and then dry the resultant product into a sheet-like article. In these cases, the hardening may be performed to a necessary degree. The inorganic filler may also be dispersed in the resin composition which is to be applied onto the reinforcing material or with which the reinforcing material is to be impregnated. Examples of the sheet-like molded article include a complex in which the inorganic filler is contained in the resin composition, a prepreg and the like.

The application method for incorporating the inorganic filler and the impregnation method for forming the prepreg are not particularly limited. Examples of these methods include: a method in which a solution in which the resin composition is dissolved or a dispersion of the resin composition is applied using a spray, a brush, a bar coater or the like; and a method in which abase is dipped in a solution having the resin composition dissolved therein or a dispersion of the resin composition (dipping). The application or impregnation may be repeated several times as required. Alternatively, the application or impregnation may also be repeated using a plurality of solutions or dispersions having different resin concentrations.

In the sheet-like molded article, it is preferred that the content of the inorganic filler or the reinforcing material is about 20 to 80% by mass relative to the amount of the sheet-like molded article. When the inorganic filler or the reinforcing material is contained at the above-mentioned ratio, the dimensional stability and strength of the sheet-like molded article after hardening can be exerted more readily. Furthermore, superior dielectric properties can also be achieved. In the case where the inorganic filler and the reinforcing material are used in combination, it is preferred that the total amount of the inorganic filler and the reinforcing material is the above-mentioned content. In the sheet-like molded article, a coupling agent such as a silane-type coupling agent and a titanate-type coupling agent may be added as required.

Whether or not the resin in the sheet-like molded article is based on the above-mentioned resin composition can be determined by confirming the components thereof by the analysis by infrared spectroscopy (IR) and gas chromatography (GC). In addition, the chemical composition can be confirmed by the analysis by nuclear magnetic resonance spectroscopy (NMR) and mass spectrometry-gas chromatography (GC-MS). In this case, the resin in the sheet-like molded article exists in a semi-cured state.

The sheet-like molded article may be subjected to, for example, heat molding and then processed into a laminate. The laminate can be produced by laminating a plurality of sheet-like molded articles depending on the desired thickness and then subjecting to heat (hardening) compression molding. It is also possible to combine the laminate with another sheet-like molded article (e.g., a prepreg) to produce a thicker laminate. The lamination molding and the hardening are generally performed simultaneously using a heat pressing machine, but may be performed separately. Namely, firstly the lamination molding is performed to produce a semi-cured laminate and then the semi-cured laminate is completely hardened by the treatment with a heat processing machine. The heat compression molding is carried out, for example, at 80 to 300° C. for about 1 minute to 10 hours while applying a pressure of 0.1 to 50 MPa, and is preferably carried out at 150 to 250° C. for about 10 minutes to 5 hours while applying a pressure of 0.5 to 10 MPa.

Next, an example in which the organic insulating body is applied to a metal-clad laminate will be described. Firstly, the metal-clad laminate according to the present embodiment is provided with an organic insulating body and a metallic foil laminated on at least one surface of the organic insulating body. For example, the metal-clad laminate according to the present embodiment can be produced by laminating metallic foils respectively on both surfaces of a raw insulating sheet that served as a raw material for the organic insulating body and then subjecting the resultant product to heat compression molding (hardening). The conditions for the heat compression are not particularly limited.

For example, the molding may be carried out under the heat compression conditions of, for example, 180 to 220° C. at about 2 to 5 MPa.

The metallic foil is not particularly limited, and examples thereof include a copper foil such as an ectrodeposited copper foil and a rolled copper foil, an aluminum foil, and a composite foil composed of these metallic foils interposed on each other. Among these metallic foils, a copper foil can be used for example. The thickness of the metallic foil is not particularly limited, and is, for example, about 5 to 105 μm. The surface roughness Sa of the metallic foil may be 0.5 μm or less, and is preferably 0.3 μm or less. The metal-clad laminate according to the present embodiment can also be produced by laminating a desired number of organic insulating bodies and a desired number of metallic foils on each other and then subjecting the resultant laminate to heat compression molding. The metal-clad laminate according to the present embodiment may have a dielectric tangent of 0.0017 or less. When the dielectric tangent of the metal-clad laminate is 0.0017 or less, sufficient electric properties including an excellent dielectric constant can be achieved. The metal-clad laminate according to the present embodiment can be used in, for example, a printed wiring board.

On the metallic-foil-side surface of the organic insulating body, i.e., a surface of the organic insulating body which is in contact with the metallic foil, a peak for an organic substance having a molecular weight of 340 to 350 may appear when analyzed by time-of-flight secondary ion mass spectrometry (TOF-SIMS), and the count number of the peak may be 500 or more. The count number of the peak is preferably 1000 or more. For example, it is preferred that the count number of an organic substance having a molecular weight of 342 to 346 is 700 to 2400. In another expression, the ratio of the count number (M1) of an organic substance having a molecular weight of 342 to 346 to the count number (M2) of an organic substance having a molecular weight of 207, i.e., (M1/M2), may be 1.5 or more, and is preferably 1.5 to 6.

Whether or not an organic substance having a molecular weight of 340 to 350 is present between the organic insulating body and the metallic foil can be confirmed by etching the metallic foil with, for example, a peroxydisulfate salt and then subjecting an exposed metallic-foil-side surface of the organic insulating body to TOF-SIMS. The analysis device to be used is, for example, TRIFT III (manufactured by ULVAC-PHI), the conditions to be employed include the use of $^{197}$Au 1 cluster ion as a primary ion, a primary ion current amount of 900 pA (aperture: 3), a measurement area of about 100 μm×100 μm and a measurement time of 2 min, and a charge collection electron gun can be used for the measurement. One example of the analysis results obtained by TOF-SIMS are shown in FIG. 6.

Although the structure of an organic substance having a molecular weight of 340 to 350 which exists between the organic insulating body and the metallic foil is unclear, it becomes possible to improve the bond strength between the metallic foil and the organic insulating body by interposing the organic substance having a molecular weight of 340 to 350 between the organic insulating body and the metallic foil even when the surface roughness of the surface of the metallic foil is small.

When an organic insulating body according to a second embodiment which contains a thermosetting cyclic olefin copolymer and a thermoplastic cyclic olefin copolymer is used, the dielectric constant and the dielectric tangent can be reduced compared with the case where the organic insulating body according to the first embodiment which contains only a thermosetting cyclic olefin copolymer. It is also possible to arrange a metallic foil that has been subjected to a surface treatment (e.g., a treatment with an acrylic silane coupling) on a precursor of the organic insulating body. When this metallic foil is used, the precursor can be softened more easily upon the hardening by a heat compression treatment compared with the case where only the thermosetting cyclic olefin copolymer is used. As a result, the metallic foil and the organic insulating body can be adhered more tightly and the bond strength between the organic insulating body and the metallic foil can be improved. Furthermore, a reaction product between the organic insulating body and the coupling agent can be formed between the organic insulating body and the metallic foil and therefore the bond strength between the organic insulating body and the metallic foil can be further improved.

Figure 5A:
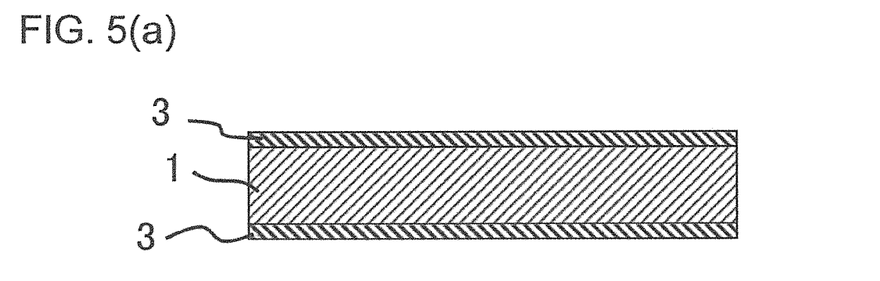
FIG. 5(a) shows a cross-sectional view illustrating one embodiment of a copper-clad laminate.

In FIG. 5(*a*), one embodiment of the copper-clad laminate is shown. The copper-clad laminate shown in FIG. 5(*a*) is provided with copper foils 3 respectively on both of an upper surface and a lower surface of the organic insulating body 1 as observed in the thickness direction. When each of the copper foil 3-side surfaces of the organic insulating body 1 is analyzed by TOF-SIMS, a peak for an organic substance having a molecular weight of 340 to 350 appears and the count number of the peak is 500 or more. Alternatively, the copper foil 3 may be arranged on at least one surface of the organic insulating body 1.

Next, a wiring board according to the present embodiment will be described. The wiring board according to the present embodiment is provided with a plurality of insulating layers and a plurality of conductor layers respectively arranged between the insulating layers, in which each of the insulating layers are formed from the organic insulating body. Besides the multi-layer wiring board in which the insulating layers and the conductor layers are multilayered alternately, the wiring board according to the present embodiment can also be used as a wiring board having a cavity structure.

The wiring board according to the present disclosure can be produced by, for example, overlaying an inner layer having a circuit and a through-hole formed therein and a prepreg on the metal-clad laminate according to the present disclosure, then laminating a metallic foil on the surface of the prepreg, and then subjecting the resultant product to heat (hardening) compression molding. It is also possible to form a circuit and a through-hole in the metallic foil formed on the surface of the prepreg to produce a multi-layer printed wiring board. It is preferred that the insulating layer that constitutes the wiring board according to the present embodiment contains a cyclic olefin polymer as the main component and has such a property that a phenyl group can be detected by infrared spectrometry.

According to the wiring board of the present embodiment, the organic insulating body is used as the insulating layer, and therefore a low dielectric constant and a low dielectric tangent can be achieved even after the wiring board is allowed to leave at a high temperature, and excellent high-frequency properties can also be achieved.

The wiring board of this type can be produced, for example, through a step of preparing a resin composition that can serve as the above-mentioned organic insulating body, a step of molding the resin composition into a sheet-like form to produce a semi-cured insulating sheet, a step of attaching a metallic foil that serves as a conductor layer onto the surface of the insulating sheet, and a step of subjecting the insulating sheet having the metallic foil attached thereto to heat compression under specific conditions (temperature, pressure and atmosphere).

Figure 5B:
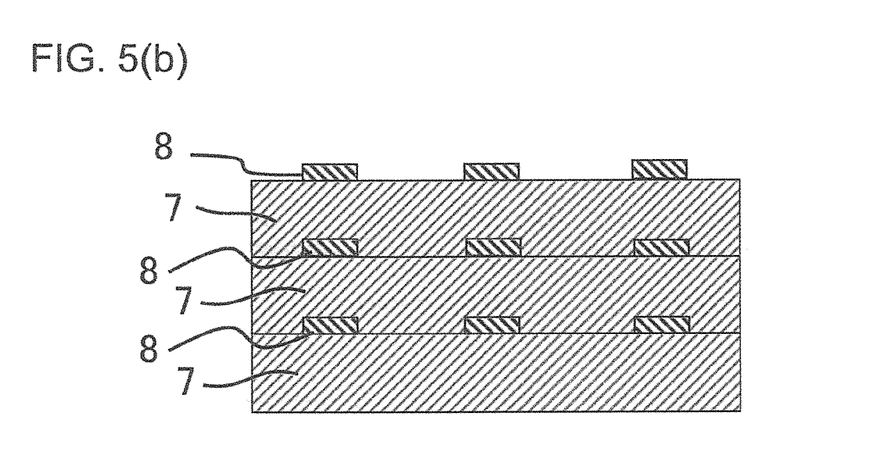
FIG. 5(b) shows a cross-sectional view illustrating one embodiment of a wiring board.

Next, one embodiment of the wiring board according to the present disclosure will be described with reference to FIG. 5(b). The one embodiment of the wiring board is provided with a plurality of insulating layers 7 (organic insulating bodies 1) and a plurality of wiring layers 8 (copper foils 3) respectively arranged on the insulating layers 7. Besides the multi-layer wiring board in which the insulating layers 7 and the wiring layers 8 are multilayered alternately, the wiring board according to the present embodiment can also be used as a wiring board having a cavity structure.

According to the wiring board of the present embodiment, the organic insulating bodies 1 are used as the insulating layers 7, and therefore a low dielectric constant and a low dielectric tangent can be achieved even after the wiring board is allowed to leave at a high temperature, and excellent high-frequency properties can also be achieved. When the copper foil 3 is etched and the exposed surface of the organic insulating body 1 on the copper foil 3 side is analyzed by TOF-SIMS, it is preferred that a peak for an organic substance having a molecular weight of 340 to 350 appears and the count number of the peak is 500 or more. It is more preferred that the count number of the peak is 1000 or more. The analysis by TOF-SIMS can be carried out, for example, in the following manner: the upper surface of the wiring board is ground until the wiring layer 8 is exposed on the copper foil 3, then the exposed wiring layer 8 is etched to expose the insulating layer 7 formed from the organic insulating body 1, and then the surface of the insulating layer 7 is analyzed.

The wiring board of this type can be produced, for example, through a step of preparing a resin composition that can serve as the above-mentioned organic insulating body 1, a step of molding the resin composition into a sheet-like form to produce a semi-cured insulating sheet, a step of attaching a copper foil 3 that serves as a wiring layer onto the surface of the insulating sheet, a step of etching the copper foil 3 into a desired pattern to form a wiring layer 8, and a step of subjecting the insulating sheet having the wiring layer 8 formed thereon to heat compression under specific conditions (temperature, pressure and atmosphere).

EXAMPLES

Hereinbelow, the embodiments of the present disclosure will be described more specifically by way of examples. However, the embodiments of the present disclosure will not be limited to these examples.

The components used in Examples 1 to 13 and Comparative Example 1 are as follows.
(Cyclic Olefin Copolymers)
  Thermosetting COC: a cyclic olefin copolymer having a crosslinkable functional group (manufactured by Mitsui Chemicals, Inc.)
  Thermoplastic COC: cyclic olefin copolymer having no crosslinkable functional group (manufactured by Mitsui Chemicals, Inc.)
(Peroxide Having a Benzene Ring)
  PERBUTYL D: di-t-butylperoxide (manufactured by NOF CORPORATION, having no benzene ring)
(Other Additives)
  Silica particles having a mean particle size of 1 μm
  A flame retardant agent (bromine-type)

Examples 1 to 4

The components shown in Table 1 were mixed together at the content ratio shown in Table 1, and then the resultant mixture was stirred at room temperature (25° C.) to produce a resin composition. The peroxide having a benzene ring was added in an amount of 1.8 parts by mass relative to 100 parts by mass of the cyclic olefin copolymer. As the flame retardant agent, "SAYTEX8010 (manufactured by Albemarle Corporation)" was used. The flame retardant agent was used in an amount of 30 parts by mass relative to the total amount, i.e., 100 parts by mass, of the cyclic olefin copolymer and the peroxide having a benzene. Subsequently, the resin composition was dissolved in xylene to produce a resin varnish. The ratio of the amount of the resin composition to the amount of xylene was 40:60 by mass. Subsequently, the resin varnish was molded into a sheet-like article using a bar coater, and the sheet-like article was dried at 150° C. for 4 minutes. In this manner, sheet-like molded articles each having a thickness of 15 μm were produced.

Examples 5 to 8

The components shown in Table 1 were mixed together at the content ratio shown in Table 1, and then the resultant mixture was stirred at room temperature (25° C.) to produce a resin composition. The peroxide having a benzene ring was added in an amount of 1.8 parts by mass relative to 100 parts by mass of the cyclic olefin copolymer. As the flame retardant agent, "SAYTEX8010 (manufactured by Albemarle Corporation)" was used. The flame retardant agent was used in an amount of 30 parts by mass relative to the total amount, i.e., 100 parts by mass, of the cyclic olefin copolymer and the peroxide having a benzene. The silica particles were used in an amount of 20 parts by mass relative to the total amount, i.e., 100 parts by mass, of the cyclic olefin copolymer and the peroxide having a benzene ring. Subsequently, the resin composition was dissolved in xylene to produce a resin varnish. The ratio of the amount of the resin composition to the amount of xylene was 40:60 by mass. Subsequently, the resin varnish was molded into a sheet-like article using a bar coater, and the sheet-like article was dried at 150° C. for 4 minutes. In this manner, sheet-like molded articles each having a thickness of 15 μm were produced.

Comparative Example 1

A thermoplastic COC was dissolved in xylene to produce a resin varnish. The ratio of the amount of the resin composition to the amount of xylene was 40:60 by mass. Subsequently, the resin varnish was molded into a sheet-like article using a bar coater, and the sheet-like article was dried at 150° C. for 4 minutes. In this manner, a sheet-like molded article having a thickness of 15 μm was produced.

Subsequently, each of the sheet-like molded articles produced in Examples 1 to 8 and Comparative Example 1 was cut into small pieces, then eight of the small pieces were laminated together, and then copper foil each having a thickness of 18 μm (surface roughness (Ra)=1.7 μm) were respectively laminated on both surfaces of the laminate. The resultant product was heated at 200° C. for 120 minutes while applying a pressure of 4 MPa to produce a copper-clad laminate having a thickness of 0.8 mm. The copper foil in the copper-clad laminate was removed, and the resultant product was subjected to a measurement of a dielectric constant and a dielectric tangent by a balanced-type circular disk resonator method at room temperature (25° C.) and a temperature of 125° C. and at 30 GHz. The results are shown in Table 1.

The copper foils were removed from each of the copper-clad laminates to produce an insulating layer, and the insulating layer was processed into a piece having a size of (70 mm in long)×(8 mm in wide) to produce an organic insulating body. The organic insulating body was subjected to a dynamic mechanical analysis (DMA) to evaluate with respect to the behaviors of a loss tangent and a storage modulus. In Table 1, storage moduli (unit: Pa) at 200° C. are shown. The components contained in the organic insulating bodies were identified by gas chromatographic analysis (GC-MS).

olefin copolymer. In the data of the dynamic mechanical analysis, it was considered that a sample having such a property that at least one loss tangent peak appeared in a temperature region of 100° C. or lower and a temperature region of 120° C. or higher was a sample in which the main component of the organic insulating body was a complex of a thermosetting cyclic olefin copolymer and a thermoplastic cyclic olefin copolymer. In Table 1, the temperature of a loss tangent peak in the data of the dynamic mechanical analysis was shown as a glass transition temperature (Tg).

TABLE 1

| | Before curing Resin composition (Parts by mass) | | | | | After curing Cyclic olefin copolymer (Result of gas chromatographic analysis) | | |
|---|---|---|---|---|---|---|---|---|
| | Thermo-setting COC | Thermo-plastic COC | Peroxide | Flame retardant agent | Silica particles | Thermo-setting | Thermo-plastic | Peroxide |
| Example 1 | 100 | 0 | 1.8 | 30 | 0 | Present | Absent | Present |
| Example 2 | 85 | 15 | 1.8 | 30 | 0 | Present | Present | Present |
| Example 3 | 70 | 30 | 1.8 | 30 | 0 | Present | Present | Present |
| Example 4 | 50 | 50 | 1.8 | 30 | 0 | Present | Present | Present |
| Example 5 | 100 | 0 | 1.8 | 30 | 20 | Present | Absent | Present |
| Example 6 | 85 | 15 | 1.8 | 30 | 20 | Present | Present | Present |
| Example 7 | 70 | 30 | 1.8 | 30 | 20 | Present | Present | Present |
| Example 8 | 50 | 50 | 1.8 | 30 | 20 | Present | Present | Present |
| Comparative Example 1 | 0 | 100 | 0 | 0 | 0 | Absent | Present | Absent |

| | After curing | | | | | |
|---|---|---|---|---|---|---|
| | Dinamic methanical analysis (Loss tanget peak) | | | | Dielectric property | |
| | Tg (Low temperature side) | Tg (High temperature side) | Number of peaks | Storage modulus (1 Hz/200° C.) | Dielectric constant (30 GHz) | Dielectric tangent (30 GHz) |
| Example 1 | — | 125.6° C. | 1 | $1.4 \times 10^8$ Pa | 2.7 | 0.002 |
| Example 2 | 90° C. | 130° C. | 2 | $1.3 \times 10^7$ Pa | 2.68 | 0.0018 |
| Example 3 | 90° C. | 137° C. | 2 | $1.1 \times 10^7$ Pa | 2.66 | 0.0013 |
| Example 4 | 90° C. | 147° C. | 2 | $8 \times 10^8$ Pa | 2.63 | 0.0014 |
| Example 5 | — | 125.6° C. | 1 | $1.4 \times 10^8$ Pa | 2.7 | 0.002 |
| Example 6 | 90° C. | 130° C. | 2 | $1.3 \times 10^7$ Pa | 2.68 | 0.0018 |
| Example 7 | 90° C. | 137° C. | 2 | $1.1 \times 10^7$ Pa | 2.66 | 0.0013 |
| Example 8 | 90° C. | 147° C. | 2 | $8 \times 10^6$ Pa | 2.63 | 0.0014 |
| Comparative Example 1 | 90° C. | — | 1 | $7 \times 10^6$ Pa | 2.56 | 0.0008 |

The content of each of a flame retardant agent and silica particles is shown as a content (part(s) by mass) when the total amount of a cyclic olefin copolymer and a peroxide is 100 parts by mass.

Whether each of the cyclic olefin copolymers was thermosetting or thermoplastic was determined from date obtained by gas chromatographic analysis (GC-MS) and data obtained by the dynamic mechanical analysis. In this case, in the data of the dynamic mechanical analysis, a sample having such a property that at least one loss tangent peak appeared in a temperature region of 120° C. or higher was determined as a sample in which the main component of the organic insulating body was composed of only a thermosetting cyclic olefin copolymer. In the data of the dynamic mechanical analysis, it was assumed that a sample having such a property that at least one loss tangent peak appeared in a temperature region of 100° C. or lower was a sample in which the main component of the organic insulating body was formed from only a thermoplastic cyclic As apparent from the results shown in Table 1, in Examples 1 to 8 in each of which a cyclic olefin copolymer was the main component, a peroxide having a benzene ring was contained and a loss tangent peak appeared at 125.6° C. or higher in the dynamic mechanical analysis, the dielectric constants were 2.7 or less and the dielectric tangents were 0.002 or less under room temperature (25° C.) at a frequency of 30 GHz. Among these samples, in the samples of Examples 2 to 4 and 6 to 8 in each of which the cyclic olefin copolymer that was the main component was a complex of a thermosetting cyclic olefin copolymer and a thermoplastic cyclic olefin copolymer, the dielectric constants were 2.68 or less and the dielectric tangents were 0.0018 or less at 30 GHz.

In addition, in Examples 1 to 8, the storage moduli determined by the dynamic mechanical analysis were $8 \times 10^6$ Pa or more. Therefore, the dielectric constants were 2.68 or less and the dielectric tangent value were 0.0018 or less even at temperatures (125° C.) higher than room temperature.

In contrast, in Comparative Example 1, although the dielectric constant was 2.56 and the dielectric tangent was 0.0006, the modulus was as small as $7 \times 10^6$ Pa, the sample was molted at 125° C. and therefore the shape could not be kept, and therefore the measurement could not be carried out.

Examples 9 to 13

The sheet-like molded article produced in Example 5 (Example 9) or the sheet-like molded article produced in Example 7 (Examples 10 to 13) was cut into small pieces, then eight of the small pieces were laminated together, and then a copper foil having a surface roughness (Sa) shown in Table 2 (each having a thickness of 18 μm) was laminated on the resultant laminate. The resultant product was heated at 200° C. for 120 minutes while applying a pressure of 4 MPa to produce a copper-clad laminate having a thickness of 0.8 mm. The copper foil was subjected to a surface treatment shown in Table 2. The copper foil in the copper-clad laminate was drawn in a direction vertical to the sheet-like molded article (organic insulating body), and the peel strength upon the tearing off of the copper foil was measured using an autograph. The results are shown in Table 2.

Figure 6A:
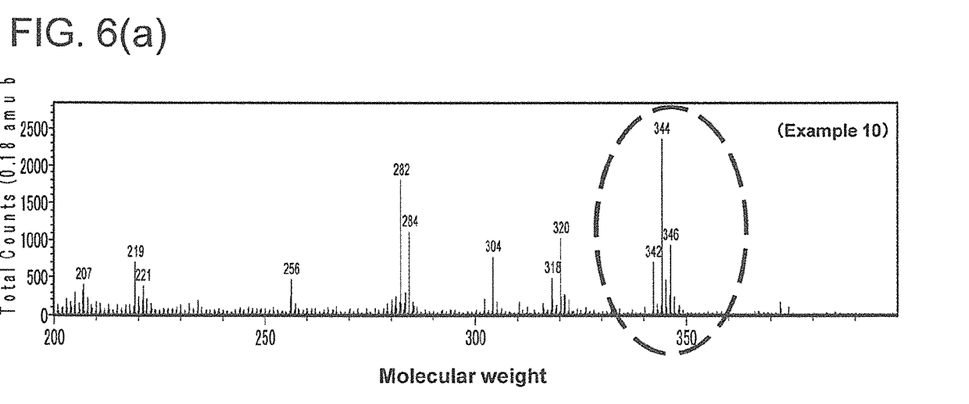
FIG. 6(a) shows analysis results in the case where a peak (count: 500 or more) for an organic substance having a molecular weight of 340 to 350 appears.
Figure 6B:
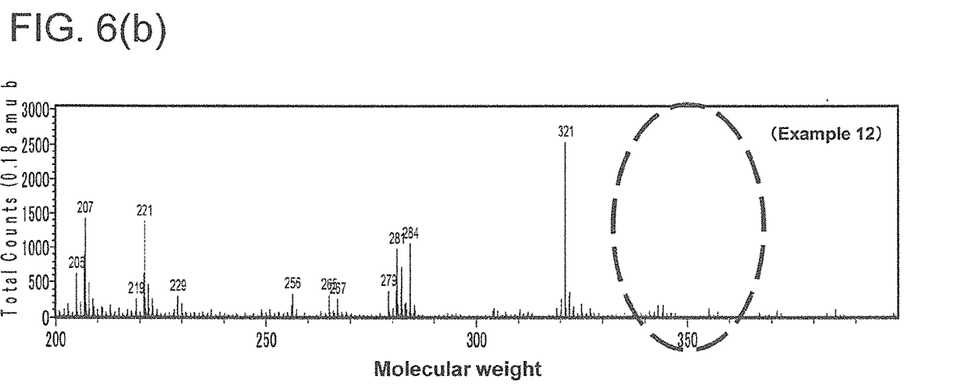
FIG. 6(b) shows analysis results in the case where any peak (count: 500 or more) for an organic substance having a molecular weight of 340 to 350 does not appear.

The copper foil was also etched with a peroxydisulfate salt (microclean: manufactured by MacDermid), and then the exposed copper-foil-side surface of the organic insulating body was measured by TOF-SIMS. The results are shown in FIG. 6. FIG. 6(a) shows the results of the positive secondary ion mass spectrometry of the surface of the organic insulating body of Example 10, and FIG. 6(b) shows the results of the positive secondary ion mass spectrometry of the surface of the organic insulating body of Example 12. In TOF-SIMS, TRIFT III (manufactured by ULVAC-PHI) was used as an analysis device, and the conditions to be employed included $^{197}$Au 1 cluster ion as a primary ion, a primary ion current amount of 900 pA (aperture: 3), a measurement area of about 100 μm×100 μm and a measurement time of 2 minutes, and a charge collection electron gun was used for the measurement.

For example, in Example 10, as shown in FIG. 6(a), the count number of a peak coming from an organic substance having a molecular weight of 342 was 700, the count number of a peak coming from an organic substance having a molecular weight of 344 was 2400, and the count number of a peak coming from an organic substance having a molecular weight of 346 was 900. In Example 12, as shown in FIG. 6(b), the count number of each of peaks coming from organic substances having molecular weights of 340 to 350 was 300 or less.

TABLE 2

| | Organic insulation body | Surface treatment Coupling treatment | Surface roughness Sa(μm) | Organic substance having molecular weight of 340 to 350* | Peel strength (kN/m) |
|---|---|---|---|---|---|
| Example 9 | Example 5 | Acrylic silane | 0.2 | Yes | 0.70 |
| Example 10 | Example 7 | Acrylic silane | 0.2 | Yes | 0.81 |
| Example 11 | Example 7 | Acrylic silane | 0.5 | Yes | 1.20 |
| Example 12 | Example 7 | — | 0.2 | No | 0.21 |
| Example 13 | Example 7 | Aminosilane | 0.2 | No | 0.40 |

*With respect to peaks of organic substances each having molecular weights of 340 to 350, the presence of an organic substance was determined "yes" when the count number was 500 or more, while the presence of an organic substance was determined "no" when the count number was less than 500.

As apparent from the results shown in Table 2, in Examples 9 to 13, it was demonstrated that the peel strength was in practically acceptable levels. In Examples 9 to 11 in each of which a peak coming from an organic substance having a molecular weight of 340 to 350 and having a count number of 500 or more appeared on the surface of the organic insulating body, excellent high-frequency properties were achieved and the peel strength was as high as 0.70 kN/m or more. Particularly in Examples 10 and 11 in which both of a thermosetting cyclic olefin copolymer and a thermoplastic cyclic olefin copolymer were contained, peel strength was higher than that in Example 9 in which a thermosetting olefin copolymer was contained, and was 0.81 kN/m or more.

The components used in Examples 14 to 29 and Comparative Examples 2 to 13 are as follows.
(Cyclic Olefin Copolymers)
  LCOC-4: a cyclic olefin copolymer having a crosslinkable functional group (manufactured by Mitsui Chemicals, Inc.)
  LCOC-3: a cyclic olefin copolymer having no crosslinkable functional group (manufactured by Mitsui Chemicals, Inc.)
(Peroxides)
  PERCURE VS: t-butyl peroxybenzoate (manufactured by NOF CORPORATION, having a benzene ring)
  PERBUTYL P: α,α'-di-(t-butylperoxy) diisopropylbenzene (manufactured by NOF CORPORATION, having a benzene ring)
  PERBUTYL C: t-butyl cumylperoxide (manufactured by NOF CORPORATION, having a benzene ring)
  PERCUMYL D: dicumylperoxide (manufactured by NOF CORPORATION, having a benzene ring)
  PERHEXYNE 25B: 2,5-dimethyl-2,5-di(t-butylperoxide) hexine-3 (manufactured by NOF CORPORATION, having no benzene ring)
  PERHEXA V: n-butyl-4,4-di(t-butylperoxy)valerate (manufactured by NOF CORPORATION, having no benzene ring)
  PERBUTYL D: di-t-butylperoxide (manufactured by NOF CORPORATION, having no benzene ring)

Examples 14 to 21 and Comparative Examples 2 to 6

The components shown in Table 3 were mixed together at the content ratio shown in Table 3, then "SAYTEX8010 (manufactured by Albemarle Corporation)" was added thereto as a flame retardant agent in an amount of 30 parts by mass relative to the total amount, i.e., 100 parts by mass, of the cyclic olefin copolymer and the peroxide, and then the resultant mixture was stirred at room temperature (25° C.) to produce a resin composition. Subsequently, the resin composition was dissolved in xylene to produce a resin varnish. The ratio of the amount of the resin composition to the amount of xylene was 40:60 by mass. Subsequently, the resin varnish was molded into a sheet-like article using a bar coater, and the sheet-like article was dried at 150° C. for 4 minutes. In this manner, sheet-like molded articles (organic insulating bodies) each having a thickness of 15 μm were produced. The glass transition temperatures (Tg) of the sheet-like molded articles are shown in Table 1. The Tg values were measured by a dynamic mechanical analysis (DMA).

Subsequently, each of the sheet-like molded articles thus produced was cut into small pieces, then eight of the small pieces were laminated together, and then copper foils each having a thickness of 18 μm were respectively laminated on both surfaces of the laminate. The resultant product was heated at 200° C. for 120 minutes while applying a pressure of 4 MPa to produce a copper-clad laminate having a thickness of 0.8 mm. The copper foil in the copper-clad laminate was removed, and the resultant product was subjected to a measurement of a dielectric constant and a dielectric tangent at 10 GHz by a cavity resonator method. The results are shown in Table 3.

Examples 22 to 29 and Comparative Examples 7 to 11

The components shown in Table 4 were mixed together at the content ratio shown in Table 4, and then "SAYTEX8010" was added thereto as a flame retardant agent. In each of Examples 22 to 29 and Comparative Examples 7 to 11, the flame retardant agent was added in an amount of 30 parts by mass relative to the total amount, i.e., 100 parts by mass, of the cyclic olefin copolymer and the peroxide. In each of Examples 22 to 29 and Comparative Examples 7 to 11, methacrylated spherical silica (SFP-30M, mean particle size: 0.5 μm, manufactured by Denka Company Limited) was added in an amount of 21 parts by mass relative to the total amount, i.e., 100 parts by mass, of the cyclic olefin copolymer and the peroxide.

In each of Examples 22 to 29 and Comparative Examples 7 to 11, a resin composition was prepared in the same manner as in Examples 14 to 21 and Comparative Examples 2 to 6 mentioned above. Namely, the cyclic olefin copolymer, the peroxide, the flame retardant agent and the spherical silica were stirred at room temperature (25° C.) to produce a resin composition. Subsequently, the resin composition was dissolved in xylene to produce a resin varnish. The ratio of the amount of the resin composition to the amount of xylene was 40:60 by mass.

A glass cloth (manufactured by ASAHI KASEI E-materials Corporation) having a thickness of 100 μm was dipped

TABLE 3

| | | Copolymer | Peroxides | | Benzen ring | Dielectric constant (10 GHz) | Dielectric tangent (10 GHz) | Tg (° C.) |
|---|---|---|---|---|---|---|---|---|
| | | (% by mass) | | % by mass | | | | |
| Example | 14 | LCOC-4 (94) | PERCURE VS | (6) | Present | 2.4 | 0.0010 | 99 |
| | 15 | LCOC-4 (94) | PERBUTYL P | (6) | Present | 2.4 | 0.0020 | 170 |
| | 16 | LCOC-4 (94) | PERBUTYL C | (6) | Present | 2.4 | 0.0014 | 150 |
| | 17 | LCOC-4 (94) | PERCUMYL D | (6) | Present | 2.4 | 0.0019 | 170 |
| | 18 | LCOC-4 (97) | PERCUMYL D | (3) | Present | 2.4 | 0.0017 | 160 |
| | 19 | LCOC-4 (99) | PERCUMYL D | (1) | Present | 2.4 | 0.0015 | 160 |
| | 20 | LCOC-4 (92) | PERCUMYL D | (8) | Present | 2.4 | 0.0020 | 175 |
| | 21 | LCOC-4 (90) | PERCUMYL D | (10) | Present | 2.4 | 0.0026 | 175 |
| Comparative example | 2 | LCOC-4 (94) | PERHEXYNE 25B | (6) | Absent | 2.4 | 0.0045 | 180 |
| | 3 | LCOC-4 (94) | PERHEXA V | (6) | Absent | 2.4 | 0.0027 | 146 |
| | 4 | LCOC-4 (94) | PERBUTYL D | (6) | Absent | 2.4 | 0.0040 | 95 |
| | 5 | LCOC-4 (100) | — | | — | 2.3 | 0.0006 | 85 |
| | 6 | LCOC-3 (100) | — | | — | 2.3 | 0.0006 | 85 |

LCOC-4 is a cyclic olefin copolymer having a crosslinkable functional group.
LCOC-3 is a cyclic olefin copolymer having no crosslinkable functional group.

As shown in Table 3, it was demonstrated that the resin compositions in Examples 14 to 21 had small dielectric tangents and excellent electric properties. It was also demonstrated that the resin compositions in Examples 14 to 21 had high Tg values and excellent heat resistance.

in the resin varnish to cause the glass cloth to be impregnated with the resin varnish. Subsequently, the glass cloth was dried at 145° C. for 7 minutes. In this manner, sheet-like molded articles (organic insulating bodies (prepregs)) each having a thickness of 100 μm were produced. The resin content in each of the prepregs was 55% by mass. The glass transition temperatures (Tg) of the sheet-like molded articles are shown in Table 4.

Six pieces of each of the prepregs were laminated together, and copper foils each having a thickness of 18 μm were respectively laminated on both surfaces of the resultant laminate. The resultant laminate was heated at 200° C. for 120 minutes while applying a pressure of 4 MPa to produce a copper-clad laminate having a thickness of 0.6 mm. The copper foil in the copper-clad laminate was removed, and the resultant product was subjected to the measurement of a dielectric constant and a dielectric tangent at 10 GHz by a cavity resonator method. The results are shown in Table 4.

TABLE 4

|  |  | Copolymer (% by mass) | Peroxides | % by mass | Benzen ring | Dielectric constant (10 GHz) | Dielectric tangent (10 GHz) | Tg (° C.) |
|---|---|---|---|---|---|---|---|---|
| Example | 22 | LCOC-4 (94) | PERCURE VS | (6) | Present | 3.4 | 0.0010 | 99 |
|  | 23 | LCOC-4 (94) | PERBUTYL P | (6) | Present | 3.4 | 0.0020 | 170 |
|  | 24 | LCOC-4 (94) | PERBUTYL C | (6) | Present | 3.4 | 0.0014 | 150 |
|  | 25 | LCOC-4 (94) | PERCUMYL D | (6) | Present | 3.4 | 0.0019 | 170 |
|  | 26 | LCOC-4 (97) | PERCUMYL D | (3) | Present | 3.4 | 0.0017 | 160 |
|  | 27 | LCOC-4 (99) | PERCUMYL D | (1) | Present | 3.4 | 0.0015 | 160 |
|  | 28 | LCOC-4 (92) | PERCUMYL D | (8) | Present | 3.4 | 0.0020 | 175 |
|  | 29 | LCOC-4 (90) | PERCUMYL D | (10) | Present | 3.4 | 0.0026 | 175 |
| Comparative example | 7 | LCOC-4 (94) | PERHEXYNE 25B | (6) | Absent | 3.4 | 0.0045 | 180 |
|  | 8 | LCOC-4 (94) | PERHEXA V | (6) | Absent | 3.4 | 0.0027 | 146 |
|  | 9 | LCOC-4 (94) | PERBUTYL D | (6) | Absent | 3.4 | 0.0040 | 95 |
|  | 10 | LCOC-4 (100) | — | — |  | 3.3 | 0.0006 | 85 |
|  | 11 | LCOC-3 (100) | — | — |  | 3.3 | 0.0006 | 85 |

LCOC-4 is a cyclic olefin copolymer having a crosslinkable functional group.
LCOC-3 is a cyclic olefin copolymer having no crosslinkable functional group.

As shown in Table 4, it was demonstrated that the samples in Examples 22 to 29 had small dielectric tangents and excellent electric properties. It was also demonstrated that the samples in Examples 22 to 29 had high Tg values and excellent heat resistance. It was confirmed that each of the prepregs constituting the samples contained a cyclic olefin copolymer as the main component and had a phenyl group when analyzed by infrared spectrometry.

DESCRIPTION OF THE REFERENCE NUMERALS

1: Organic insulating body
3: Copper foil
7: Insulating layer
8: Wiring layer
A1, A10: Loss tangent
B1, B10: Storage modulus
C1, C10: Loss elastic modulus

The invention claimed is:

1. An organic insulating body comprising
    a cyclic olefin copolymer as a main component, the cyclic olefin copolymer comprising a thermosetting cyclic olefin copolymer and a thermoplastic cyclic olefin copolymer; and
    a peroxide having a benzene ring;
    wherein the organic insulating body has a loss tangent peak at 80° C. to 100° C.

2. The organic insulating body according to claim 1, wherein a storage elastic modulus measured by the dynamic viscoelasiticity measurement is $8 \times 10^6$ Pa or more.

3. A metal-clad laminate comprising an organic insulating body according to claim 1, and a metallic foil laminated on at least one surface of the organic insulating body.

4. The metal-clad laminate according to claim 3, wherein a metallic-foil-side surface of the organic insulating body has a peak for an organic substance having a molecular weight of 340 to 350 when analyzed by time-of-flight secondary ion mass spectrometry.

5. The metal-clad laminate according to claim 4, wherein the peak has a count ratio of 1.5 or more when a count number of a peak for an organic substance having a molecular weight of 207 is 1.

6. The metal-clad laminate according to claim 5, wherein the metallic foil has a surface roughness Sa of 0.5 μm or less.

7. A wiring board comprising a plurality of insulating layers and a plurality of conductor layers respectively arranged between the insulating layers, wherein each of the insulating layers is formed from an organic insulating body according to claim 1.

\* \* \* \* \*